United States Patent [19]
Fukuchi

[11] Patent Number: 5,617,061
[45] Date of Patent: Apr. 1, 1997

[54] FEED-FORWARD AMPLIFIER

[75] Inventor: Akio Fukuchi, Tokyo, Japan

[73] Assignee: NEC Corporation, Japan

[21] Appl. No.: 521,632

[22] Filed: Aug. 31, 1995

[30] Foreign Application Priority Data

Aug. 31, 1994 [JP] Japan .................................. 6-205854

[51] Int. Cl.$^6$ .................................. H03F 1/26; H03F 3/66
[52] U.S. Cl. ............................................. 330/151; 330/52
[58] Field of Search ........................... 330/52, 149, 151

[56] References Cited

U.S. PATENT DOCUMENTS

| | | | |
|---|---|---|---|
| 5,166,634 | 11/1992 | Narahashi et al. | 330/151 |
| 5,396,189 | 3/1995 | Hays | 330/149 |

FOREIGN PATENT DOCUMENTS

| | | |
|---|---|---|
| 466123 | 7/1991 | European Pat. Off. . |
| 1198809 | 2/1988 | Japan . |
| 4070203 | 7/1990 | Japan . |
| 7015397 | 1/1995 | Japan . |
| 9319524 | 9/1993 | WIPO . |

*Primary Examiner*—Steven Mottola
*Attorney, Agent, or Firm*—Ostrolenk, Faber, Gerb & Soffen, LLP

[57] ABSTRACT

The compensation range of feed-forward amplifiers is expanded. The peak value of the input or output of an auxiliary amplifier 15 is detected with a peak power measuring instrument 24, and the characteristic of a distortion detecting loop 100 is controlled with a vector adjuster 3 and a control circuit 9 so as to minimize this peak value. By controlling the characteristic of the distortion detecting loop by detecting the peak value, the range of linearity compensation is expanded compared with conventional control based on the average level.

10 Claims, 10 Drawing Sheets

N: CARRIER NUMBER

AVERAGE POWER: CONSTANT

FEED-FORWARD AMPLIFIER

BACKGROUND OF THE INVENTION

The present invention relates to a feed-forward amplifier, and more particularly to a feed-forward amplifier provided with a loop for detecting non-linear distortion of the main amplifier and a distortion eliminating loop for cancelling the detected distortion by synthesizing it into the output of the main amplifier.

Figure 6:
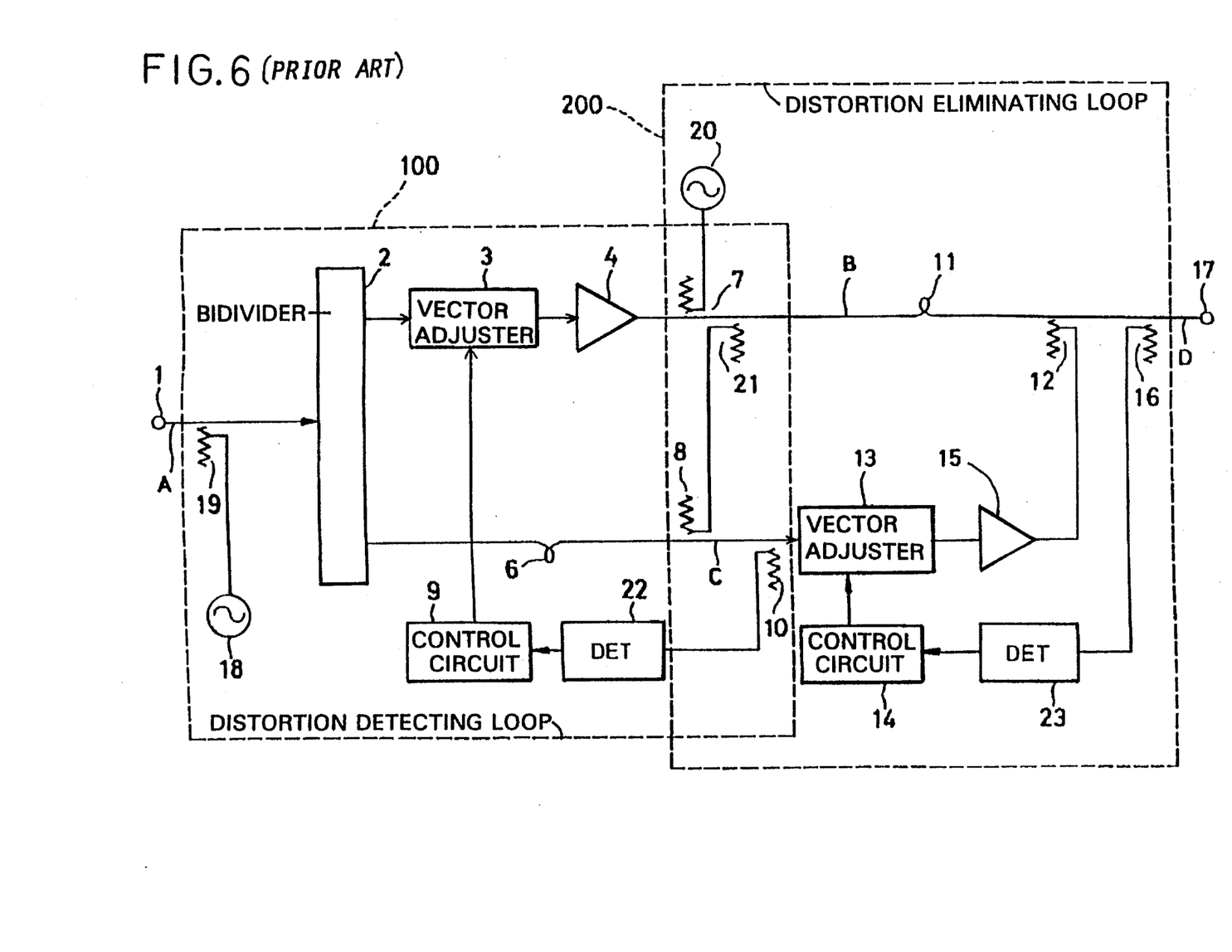
FIG. 6 is a circuit block diagram of a feed-forward amplifier according to the prior art.

Conventional linear amplifiers known to be used for simultaneous amplification of multiple frequencies in the high frequency band, among other purposes include a feed-forward amplifier disclosed in Japanese Patent Laid-open No. Hei 1(1989)-198809, for example. A typical configuration of this kind of feed-forward amplifier according to the prior art is illustrated in FIG. 6. In the feed-forward amplifier shown in this diagram, which has a distortion detecting loop 100 and a distortion eliminating loop 200, a main amplifier 4 collectively amplifies input multi-frequency multiplexed signals in the high frequency band entered through an input terminal 1. The distortion detecting loop 100 detects non-linear distortion components generating in the amplifying process by cancelling the entered signal components. The distortion eliminating loop 200 cancels the distortion components by amplifying the detected distortion components with an auxiliary amplifier 15 and again injecting the amplified distortion components into the output of the main amplifier 4.

The distortion detecting loop 100 consists of a pilot oscillator 18, a coupler (directional coupler) 19 for superimposing a pilot signal over an input signal, a bi-divider 2, a vector adjuster 3 capable of adjusting the attenuation and phase shift quantities, a main amplifier 4, a delay line 6, a coupler 10, a detector 10 (DET) 22 and a control circuit 9, and is further equipped with couplers 7 and 8 for common use with the distortion eliminating loop 200 to be described in detail below. The output signal of the coupler 8 is detected by the detector 22 via the coupler 10, and fed to the control circuit 9, which controls the vector adjuster 3 so as to minimize the output level of the detector 22.

The aforementioned distortion eliminating loop 200 comprises the couplers 7 and 8 provided for common use with the above-described distortion detecting loop 100, a pilot oscillator 20, a coupler 21, a delay line 11, a coupler 12, a vector adjuster 13 capable of adjusting the attenuation and phase shift quantities, an auxiliary amplifier 15, a coupler 16, a detector (DET) 23 and a control circuit 14.

The control circuit 14 detects a pilot signal with the output circuit of the feed-forward circuit via the coupler 16 and the detector 23, and controls the vector adjuster 13 so as to minimize the detection level of the pilot signal.

The operation of the prior art feed-forward amplifier having such a configuration will be described below. Multi-frequency multiplexed signals in the high frequency band inputted to the input terminal 1, after being super-imposed by the coupler 19 over the output signal of the pilot oscillator 18, are bi-divided by the bi-divider 2, and one part of the signals resulting from the division, after undergoing the adjustment of its attenuation and phase shift quantities by the vector adjuster 3 and supplied to the main amplifier 4 to be amplified, is multiplexed by the coupler 21 with the pilot signal from the pilot oscillator 20, and entered into the coupler 12 via the coupler 7 and the delay line 11. These input signals to the coupler 12 are main amplifier signals, which have distortion components generated during amplification by the main generator 4.

The other part of the signals resulting from the division by the bi-divider 2, after being given an equal delay time by the delay line 6 to the signal delay time of the vector adjuster 3 and the main amplifier 4, is synthesized in a reverse phase by the coupler 8 with a part of the main amplifier signal branched by the coupler 7, and the synthesized signals are entered into the coupler 10. The pilot signal contained in the partial input signal branched by the coupler 10, after being detected by the detector 22, is supplied to the control circuit 9, which adjusts the attenuation and phase shift quantities of the vector adjuster 3 so as to minimize the output signal level of the detector 22.

Here, the only constituent element between the output end of the bi-divider 2 and the coupler 8 is the delay line 6, and the distortion arising on it can be ignored. Therefore, if the operation of the aforementioned distortion detecting group 100 is appropriate, the part of the input signals having passed the vector adjuster 3 and the main amplifier 4 and been amplified is synthesized in a reverse phase by the coupler 8 to cause only the distortion component generated or mixed mainly in the main amplifier 4 to be outputted from the coupler 8.

The distortion components outputted from the coupler 8 and inputted to the coupler 10, after undergoing adjustment of its attenuation and phase shift quantities by the vector adjuster 13, are supplied to the auxiliary amplifier 15 and amplified. Then, the amplified distortion components are synthesized in a reverse phase via the coupler 12 with the main amplifier signals, which have been delayed by the delay line 11 by the time length of propagation by the vector adjuster 13 and the auxiliary amplifier 15.

These synthesized signals are supplied to the coupler 16, where a part of them is branched and entered into the detector 23. The detector 23 extracts the pilot signal in the input signal by, for instance, synchronous detection, and supplies it to the control circuit 14. The control circuit 14 controls the attenuation and phase shift quantities of the vector adjuster 13 so as to minimize the output level of the detector 23. As a result, the main amplifier signals in which the pilot signal, i.e. the distortion components, have been minimized are 10 supplied to the output terminal 17.

The spectra in sections A through D are illustrated in FIGS. 7 (A) through (D), respectively, where f1 and f2 are input frequencies, and fx and fy, spurious responses.

The feed-forward amplifier disclosed in the Patent Laid-open No. 1989-198809 described so far cannot be considered to be always performing optimal control in terms of the input/output characteristics of the amplifier for the following reason.

Figure 3:
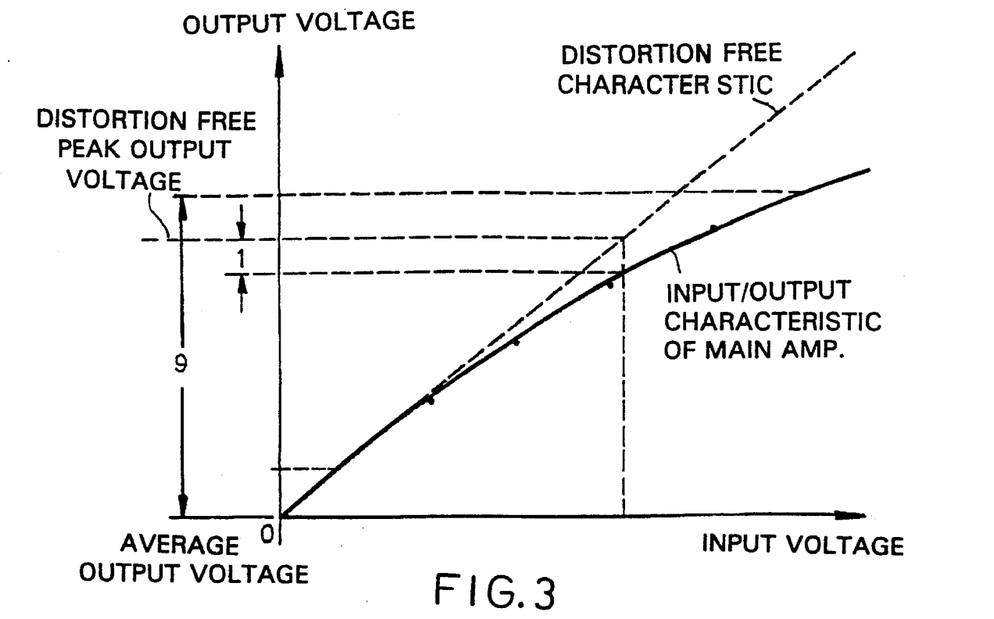
FIG. 3 shows a model of the input/output characteristics of the main amplifier when under control acceding to the prior art.
Figure 4:
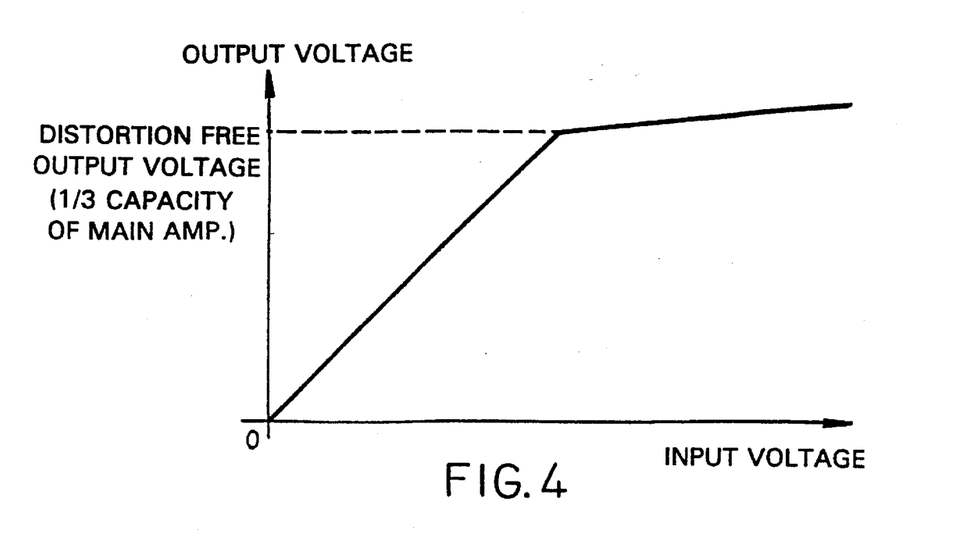
FIG. 4 shows a model of the input/output characteristics of the auxiliary amplifier.

FIG. 3 shows a model of the input/output characteristics of the main amplifier 4, the auxiliary amplifier 15 being assumed to be an ideal limiter amplifier whose output power is about 1/9 of that of the main amplifier. FIG. 4 shows a model of the input/ output characteristics of the auxiliary amplifier 15.

Figure 8:
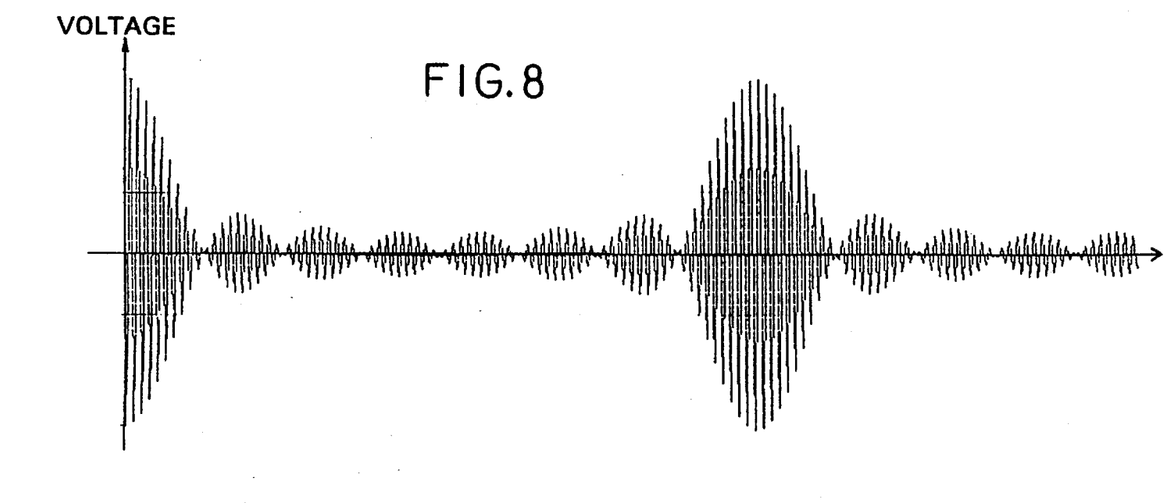
FIG. 8 is a diagram illustrating an example of a waveform synthesized from eight sine waves, wherein the initial phases of the waves are zero.
Figure 9:
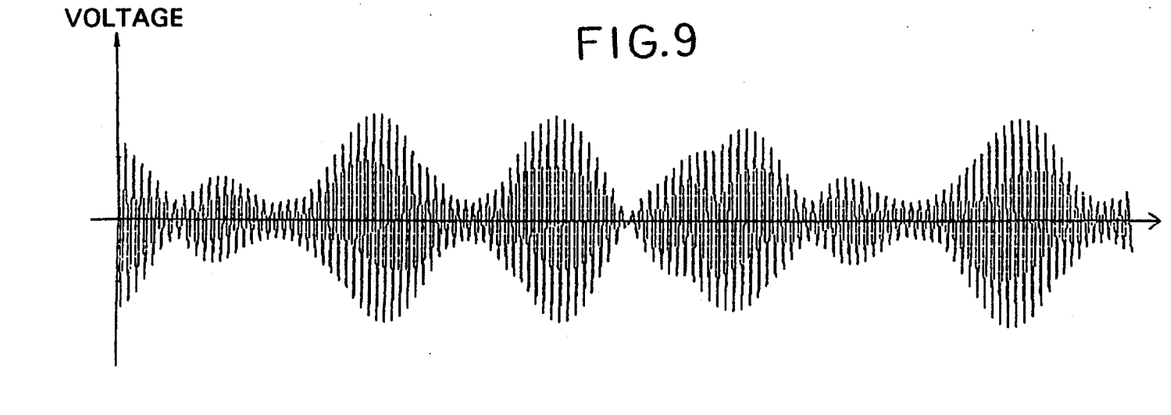
FIG. 9 is a diagram illustrating another example of a waveform synthesized from eight sine waves, wherein the initial phases of the waves are set at random.

Hereupon is considered the nature of the signals that are inputted. FIGS. 8 and 9 illustrate examples of waveforms synthesized from eight sine waves. FIG. 8 shows a case in which the initial phase of every wave is zero and FIG. 9, another case in which the initial phases are set at random.

It is known that, when signals of N waves of an equal amplitude are synthesized, the peak power is $N^2$ times the power per wave, but the power stays at this peak only for a moment.

Figure 10:
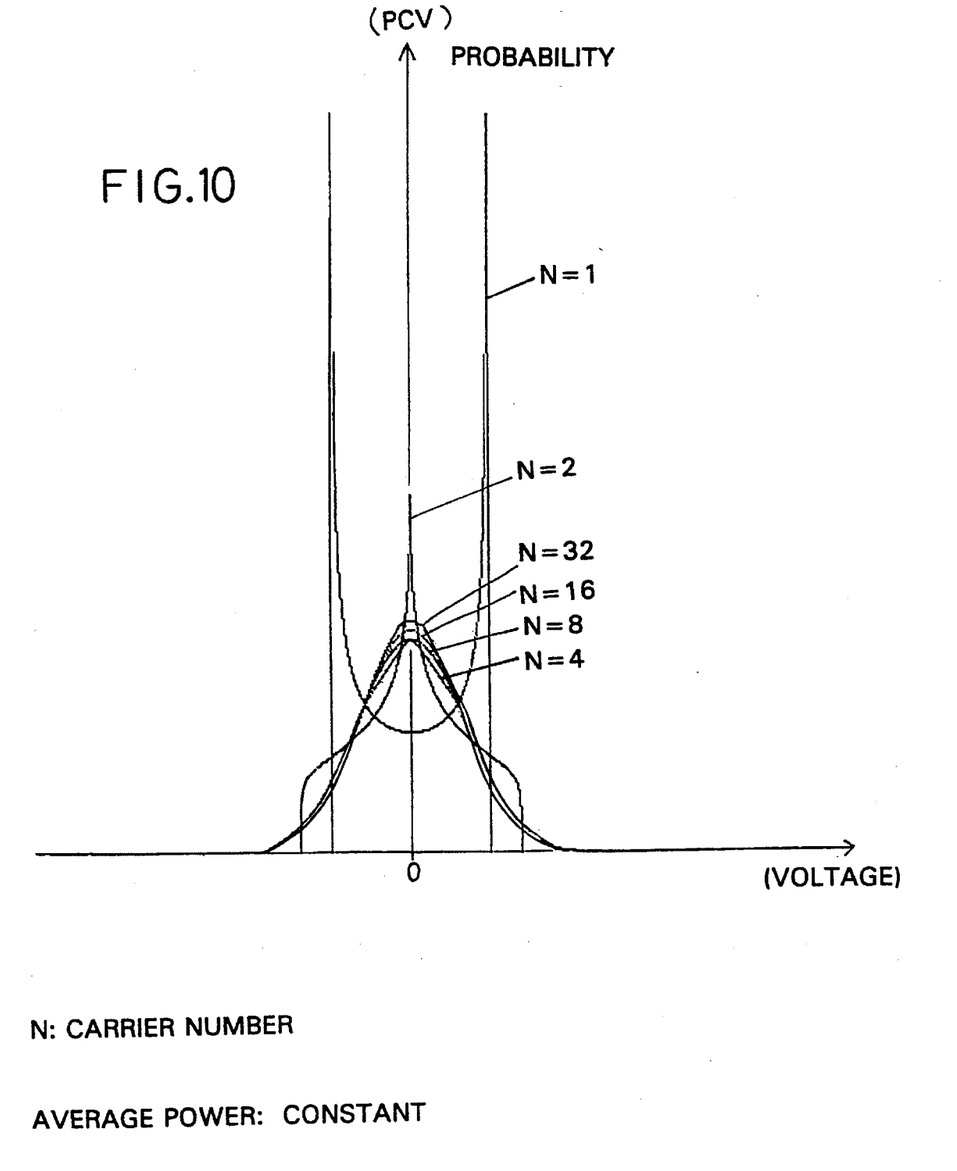
FIG. 10 is a diagram showing the distribution of instantaneous voltage of multiple carriers.

FIG. 10 illustrates the distribution of instantaneous voltage when N sine waves of which the synthetic power is constant and the phases are not correlated (N=1, 2, 4, 8, 16, 32). Statistically, the distribution of instantaneous voltage when sine waves whose phases are not correlated are synthesized follows the normal distribution pattern. Therefore, when the number N of waves is great, the expected value of the input voltage at a given point of time is low. Accordingly if, as stated in the patent Laid-open No. 1989-198809, control is accomplished by cancelling the carried by superimposing the pilot signal over the input signals to set off the pilot signal, the distortion detecting loop is controlled so as to minimize the average power of the signals entered into the auxiliary amplifier.

As shown in FIG. 10, when many carriers are entered, the probability of the input voltage at a given point of time reaches its maximum in the vicinity of 0 V. Therefore, the distortion detecting loop is controlled so as to be established in the vicinity of 0 V input. For this reason, "the characteristic deemed to be free from distortion" in FIG. 3 is a tangent near the origin of "the input/output characteristic of the main amplifier" in FIG. 3. In order to achieve amplification without distortion, it is necessary to have the auxiliary amplifier compensate for deviation between the solid line (the input/output characteristic of the main amplifier) and the dotted line (the characteristic deemed to be free from distortion) in FIG. 3. The output of the auxiliary amplifier, as it is synthesized by a directional coupler with the signals from the main amplifier, needs to be greater correspondingly to that loss.

Figure 11A:
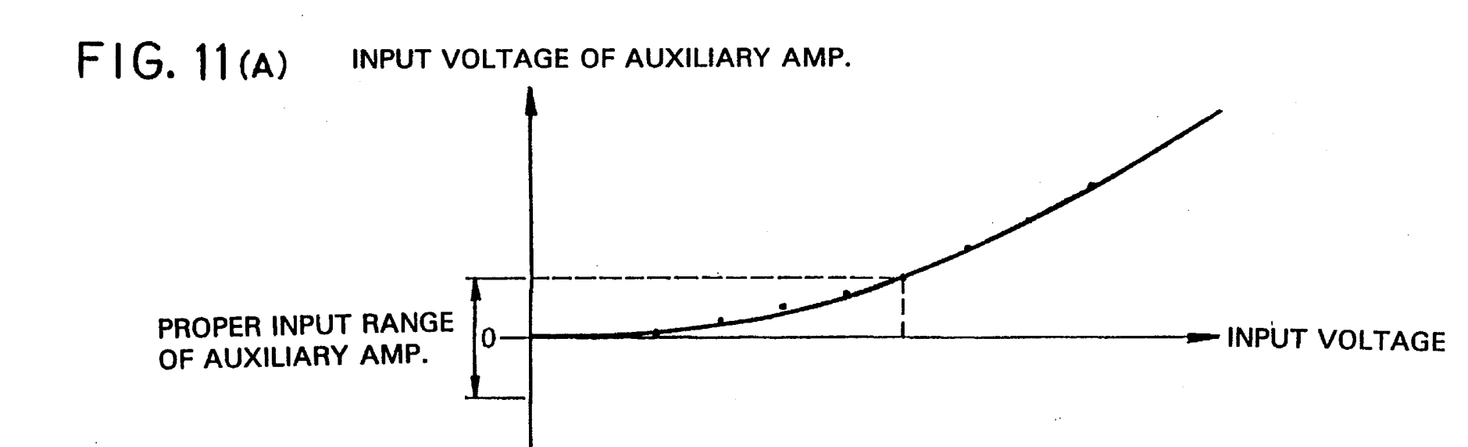

FIG. 3 shows the undistorted peak output voltage when the output of the auxiliary amplifier is synthesized by a −10 dB directional coupler and the saturated output power of the auxiliary amplifier is set to be about ⅑ of that of the main amplifier. FIG. 11 (A) shows the input voltage according to the conventional control method versus the voltage inputted to the auxiliary amplifier.

In a main amplifier to constitute a feed-forward amplifier, an operating point close to Class A is set in order to achieve a decent level of distortion characteristic even without compensation. Therefore, the gain decreases as the level of input signals rises. Consequently, the output of the auxiliary amplifier takes on a polarity to be added to that of the main amplifier. This means that only half of the available output range of the auxiliary amplifier is utilized. Accordingly, the control method according to the piror art involves the disadvantage of a narrow input range in which feed forward can normally function.

SUMMARY OF THE INVENTION

An object of the present invention, therefore, is to provide a feed-forward amplifier enabling the input range in which feed-forward can function normally to be expanded.

According to the invention, there is provided a feed-forward amplifier comprising a main amplifier for amplifying input signals; means for branching a part of the output of this main amplifier and synthesizing the branched part with said input signals; an auxiliary amplifier for amplifying this synthesized output; peak detecting means for extracting a part of the input to or the output from said auxiliary amplifier and detecting its peak value; first control means for controlling the input to said main amplifier so as to minimize the detection output of said peak detecting means; synthesizing means for synthesizing the output of said auxiliary amplifier with that of said main amplifier to cancel any distortion occurring in said main amplifier; level detecting means for extracting a part of the amplified output from said main amplifier and detecting its level; and second control means for controlling the input to said auxiliary amplifier so as to minimize the detection output of said level detecting means.

Figure 12:
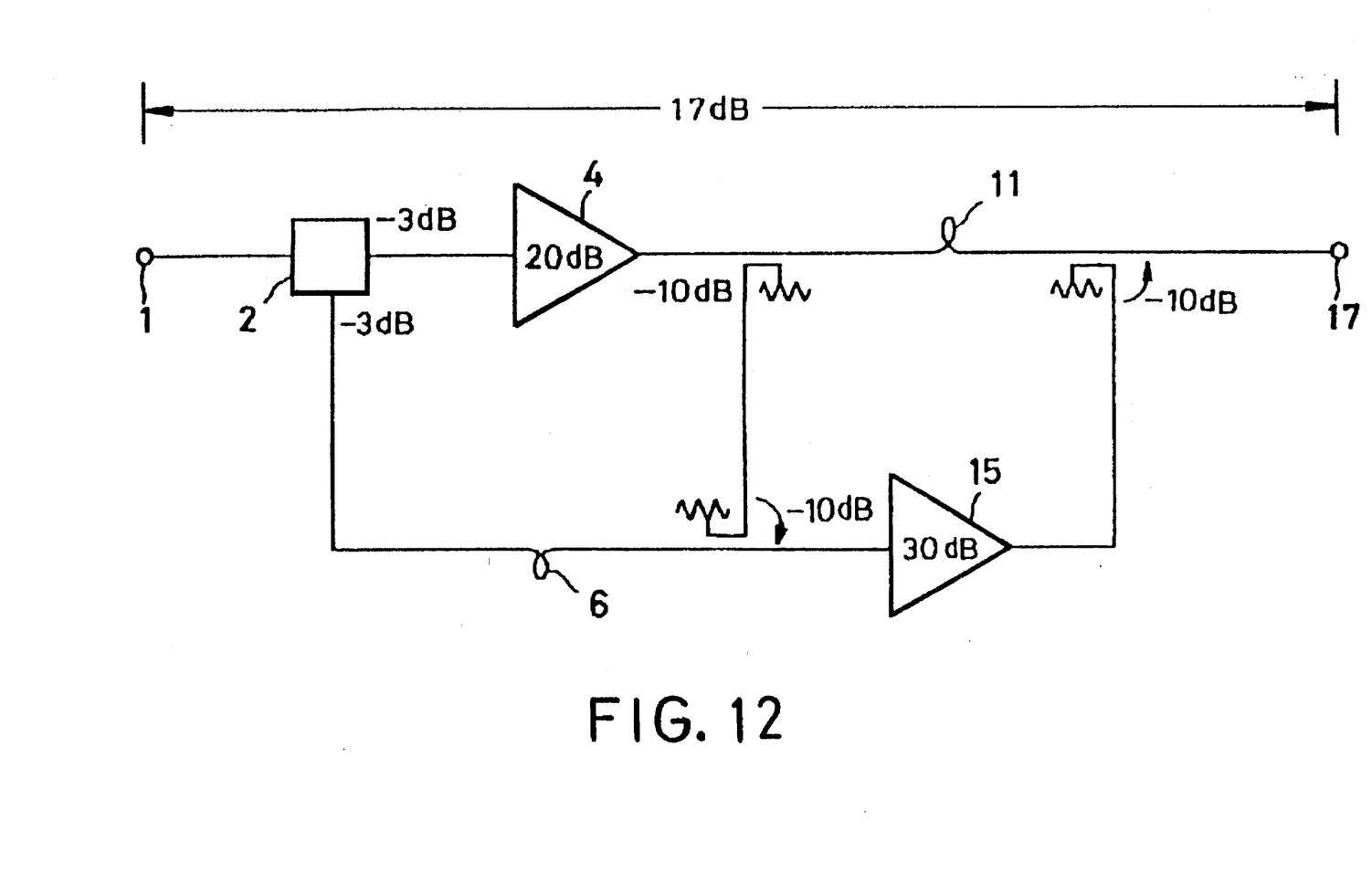
FIG. 12 illustrates one example of level diagram of a feed-forward amplifier when feed-forward operation is normal.

To consider feed-forward operation hereupon, FIG. 12 illustrates one example of level diagram representing a state in which feed forward is normally at work. In this state, the auxiliary amplifier is supposed to be an ideal amplifier having infinite saturation power and completely free from distortion. Then, even if the main amplifier is not operating, the feed-forward amplifier will be maintained in a constant state. Thus, if there is available a sufficient capacity to make up for the gain shortage of the auxiliary amplifier, the feed-forward amplifier will normally work even if no distortion detecting loop is established.

This indicates that the distortion detecting loop "has only to cancel the carrier to an extent where no distortion arises in the auxiliary amplifier". Supposing that the input/output characteristics of the auxiliary amplifier are such that there is only clipping distortion as illustrated in FIG. 4, the distortion detecting loop will have only to keep the peak value of the signals entered into the auxiliary amplifier below a certain level.

Based on this knowledge, the feed-forward amplifier according to the present invention is provided with a control circuit for controlling the distortion detecting loop by using a directional coupler for extracting a part of the input or the output of the auxiliary amplifier, a peak detector and a circuit for resetting the peak detector to minimize the output power of said detector.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 11 (A) is a diagram of the input characteristic versus the auxiliary amplifier under control according to the prior art and FIG. 11 (B), a diagram of the input characteristic versus the auxiliary amplifier under control acceding to the present invention.

DETAILED DESCRIPTION OF THE PREFERRED EMBODIMENT

Next, the present invention will be described in detail with reference to drawings.

Figure 1:
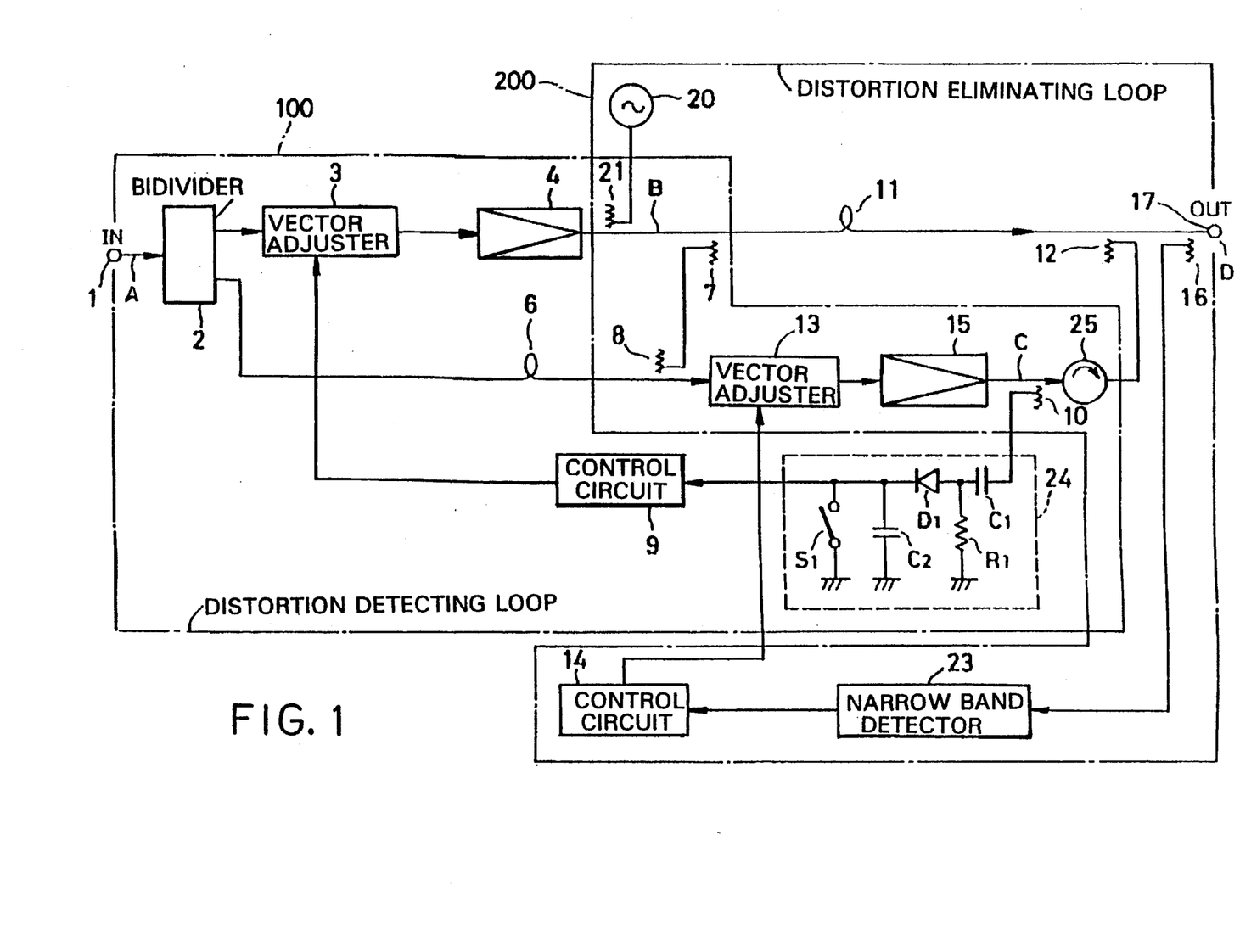
FIG. 1 is a circuit block diagram of a preferred embodiment of the present invention.
Figure 2A:
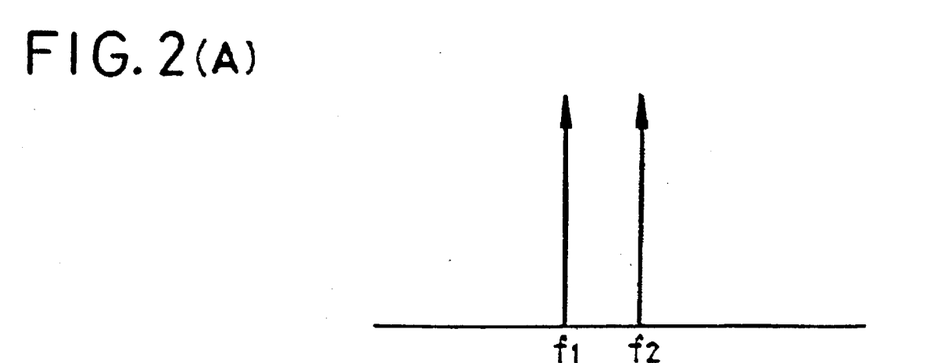
FIG. 2 is a set of diagrams illustrating spectra in different parts of blocks in FIG. 1.
Figure 2B:
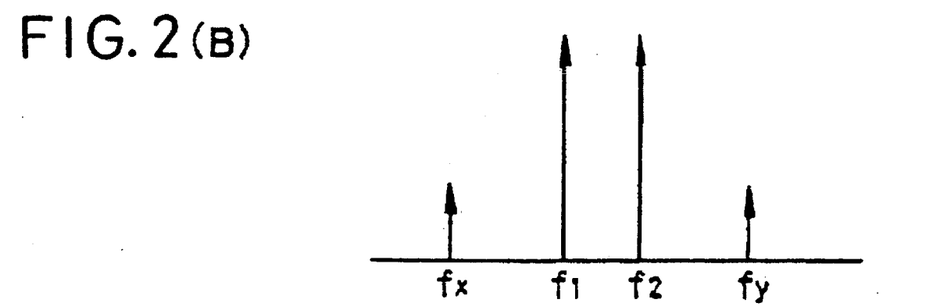
Figure 2C:
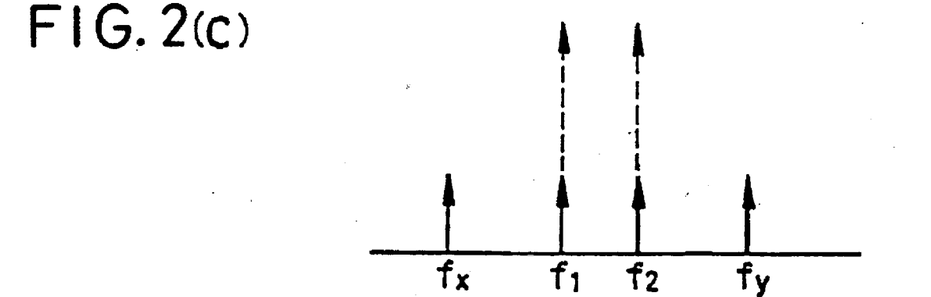
Figure 2D:
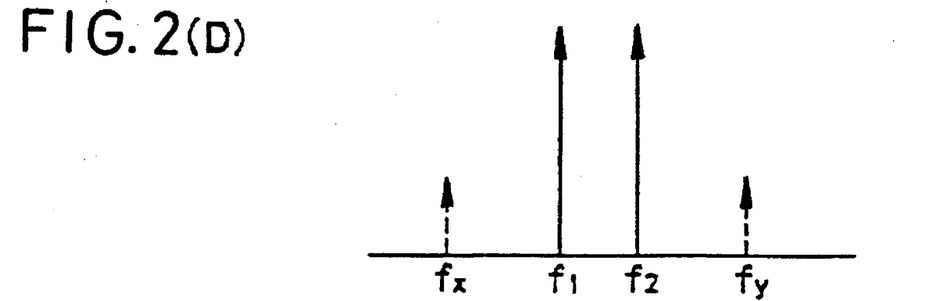

FIG. 1 is a block diagram of a preferred embodiment of the present invention, wherein parts having equivalents in FIG. 6 are denoted by the same reference codes as in FIG. 6. The feed-forward amplifier of FIG. 1 is in some respect the same as the outline of circuitry a conventional feed-forward amplifier. Thus, it is composed of a distortion detecting loop 100 for simultaneously amplifying with a main amplifier 4 multi-frequency multiplexed signals in the high frequency band entered from an input terminal 1 and detecting non-linear distortion components having arisen during the amplification by cancelling the entered signal components, and a distortion eliminating loop 200 for cancelling the distortion components by amplifying the detected distortion components with an auxiliary amplifier 15 and injecting the amplified distortion components into the output of the main amplifier 4 again.

The distortion detecting loop 100 includes a bi-divider 2, a vector adjuster 3 for adjusting the attenuation and phase shift quantities, a main amplifier 4, a delay line 6, and a control circuit 9, and is further equipped with directional couplers 7 and 8 for common use with the distortion eliminating loop 200. A peak power measuring instrument 24 measures the peak power of the input or output of the auxiliary amplifier 15 via a directional coupler 10. The control circuit 9 detects the value of the peak power measuring instrument 24, and controls the vector adjuster 3 so as to minimize the output level of the peak power measuring instrument 24.

As the peak power measuring instrument 24 holds the maximum value, faster control is made possible by having the maximum value discharged every time the control circuit 9 takes in the output voltage of the peak power measuring instrument 24 and initializing the state of the peak power measuring instrument 24. The peak power measuring instrument 24 consists of a coupling capacitor C1, a resistor R1, a diode D1, a holding capacitor C2, and a resetting switch S1, and the peak holding capacitor C2 is reset by turning on the switch S1.

The coupler 21, positioned in the common part of the distortion detecting loop 100 and the distortion eliminating loop 200, is a circuit for multiplexing the output signals of the main amplifier 4 with the pilot signal supplied from a pilot oscillator 20. The couplers 7 and 10 are circuits for branching a part of the input signals, while the coupler 8 is a circuit for combining in a reverse phase the signals branched by the coupler 7. Incidentally, reference numeral 25 denotes a circulator.

The distortion eliminating loop 200 comprises a delay line 11 for delaying signals, couplers 12 and 16 for separating or combining signals, a control circuit 14 for adjusting a vector adjuster 13, an auxiliary amplifier 15, a narrow band detector 23, the vector adjuster 13, the couplers 7 and 8 provided for common use with the above-described distortion detecting loop 100, a directional coupler 10, a pilot oscillator 20, and a directional coupler 21.

Multi-frequency multiplexed signals in the high frequency band inputted to an input terminal 1 are divided into two sets of signals by the bi-divider 2. One set of signals, after being subjected to adjustment of their attenuation and phase shift quantities by the vector adjuster 13, are supplied to the main amplifier 4. The amplified signals are multiplexed by the coupler 21 with the pilot signal generated by the pilot oscillator 20, and further entered into the coupler 12 via the coupler 7 and the delay line 11. The input signals to this coupler 12 are main amplifier signals, and therefore contain distortion components generated by the main amplifier 4.

The other set of the signals resulting from the division by the bi-divider 2 are provided an equal delay time by the delay line 6 to the signal delay time of the vector adjuster 3 and the main amplifier 4. The signals having passed the delay line 6, after being synthesized by the coupler 8 in a reverse phase with that part of the main amplifiers signals branched by the coupler 7, are entered into the coupler 10 via the auxiliary amplifier 15. The coupler 10 branches a part of the input signals, and sends the branched signal to the peak power measuring instrument 24. The peak power measuring instrument 24 detects the peak power of the auxiliary amplifier 15, and provides it to the control circuit 9, which adjusts the vector adjuster 3 so as to minimize the output signal level of the peak power measuring instrument 24. Thus the foregoing establish the optimal distortion detecting loop.

The only constituent element between the output 10 end of the bi-divider 2 and the coupler 8 is the delay line 6, so that there is no distortion generating element. Therefore, if the operation of the aforementioned distortion detecting loop 100 is appropriate, the deviation of the outputs of the vector adjuster 3 and the main amplifier 4 from the input/output characteristic deemed free from distortion in FIG. 5 (mainly the distortion component generated in the main amplifier 4) is supplied from the coupler 8 via the auxiliary amplifier 15 to the coupler 10.

The distortion components entering the coupler 10, after undergoing adjustment of its attenuation and phase shift quantities by the vector adjuster 13, are coupled to the auxiliary amplifier 15 and supplied to the coupler 12. In the coupler 12, the main amplifier signals, which have been delayed by the delay line 11 by the time length of propagation by the vector adjuster 13 and the auxiliary amplifier 15, are synthesized in a reverse phase with the output signals of the auxiliary amplifier 15. These synthesized signals are supplied to the coupler 16, where a part of them is branched and detected by the narrow band detector 23, and the detection output is entered into the control circuit 14.

This narrow band detector 23 extracts the pilot signal in the input signal by, for instance, synchronous detection, and supplies it to the control circuit 14. The control circuit 14 controls the characteristics of the vector adjuster 13 so as to minimize the output level of the narrow band detector 23. As a result, the main amplifier signals in which the pilot signal, i.e. the distortion components, have been minimized are supplied to an output terminal 17.

The spectra in different sections of the circuit of FIG. 1 are illustrated in FIG. 2, where f1 and f2 are input frequencies, and fx and fy are spurious responses, which are distortion components attributable to the main amplifier 4.

As shown in FIG. 2 (C), in the spectrum at output point C of the auxiliary amplifier 15 in FIG. 1, unlike (C) in FIG.

Figure 7A:
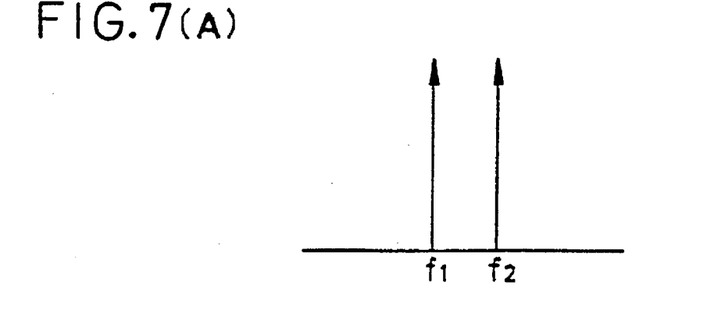
FIG. 7 is a set of diagrams illustrating spectra in different parts of blocks in FIG. 6.
Figure 7B:
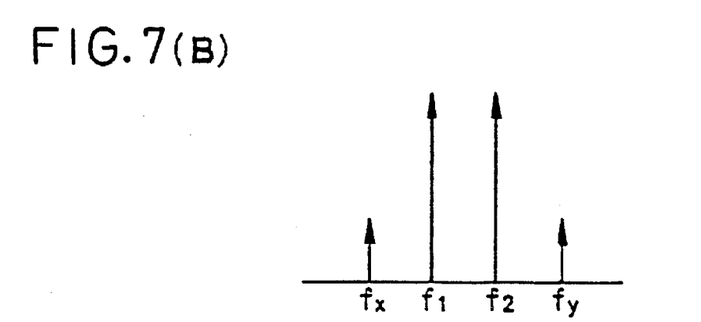
Figure 7C:
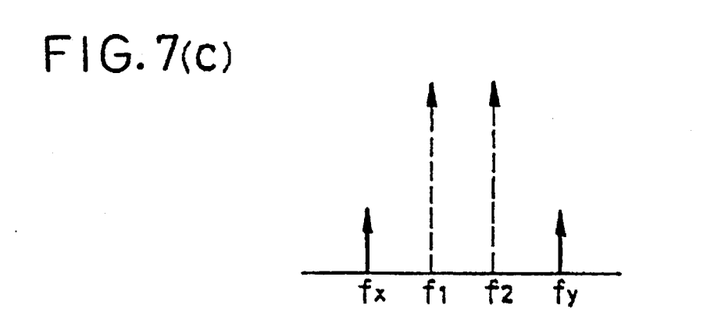
Figure 7D:
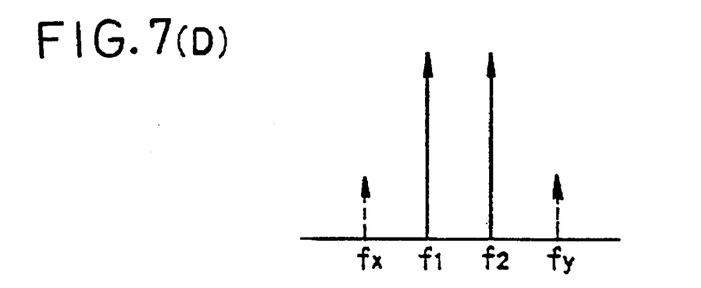

7 according to the prior art, there remain input frequencies f1 and f2, but this is due to the detection of the peak value and the control to minimize it. The example of the prior art in FIG. 6 differs in that the control of the distortion detecting loop is accomplished by detecting the average level of signals and by minimizing that level.

As stated above, in multi-frequency simultaneous amplification where a feed-forward amplifier is actually used, the average power consumption is only 1/8 to 1/9 of the required peak power. Accordingly, if control to minimize distorted power is performed with a distortion detecting loop, feed-forward control is accomplished at the input/output characteristic of the main amplifier according to "the characteristic deemed to be free from distortion" as shown by a dotted line in FIG. 3.

However, as the input/output characteristic of a main generator usually is what is represented by a solid line in FIG. 3, the deviation of the input/output characteristic of the main amplifier has to be made up for with an output from the auxiliary generator. Therefore, the characteristic in FIG. 3 or 4 is compensated linearity up to a peak value no more than a few times the average power.

Figure 5:
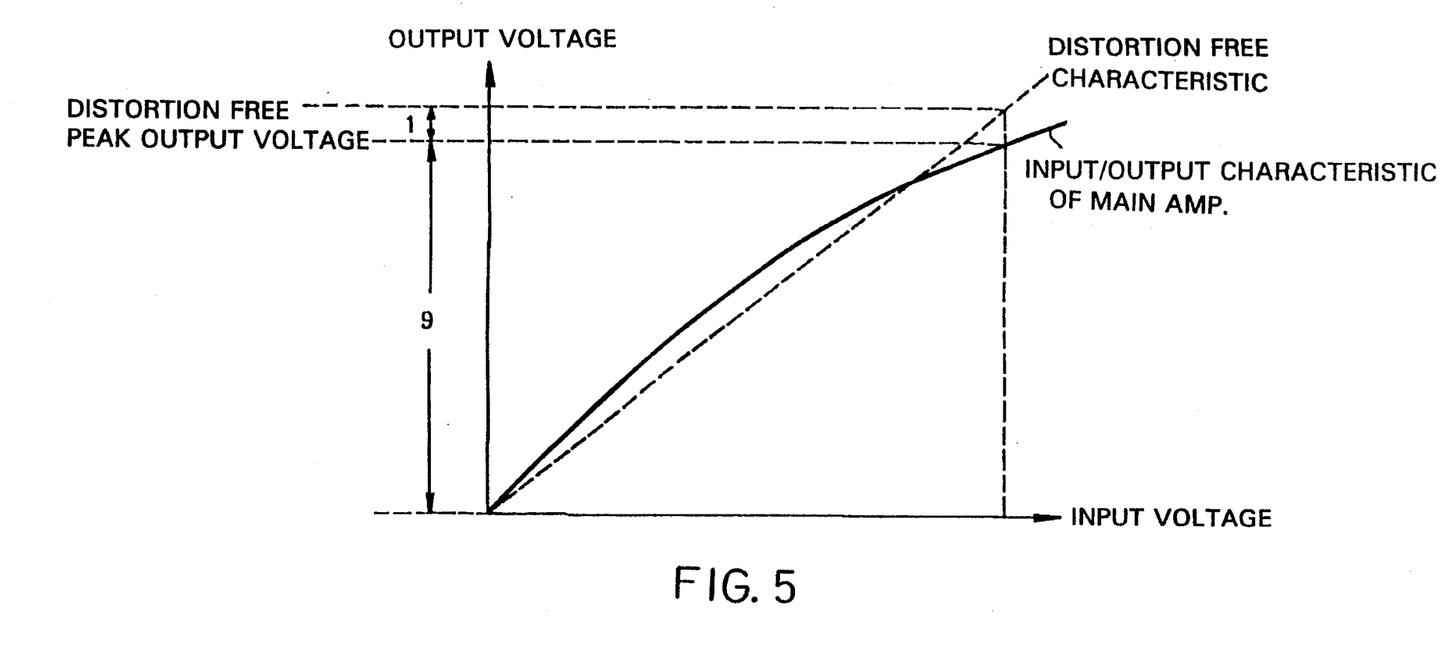
FIG. 5 shows a model of the input/output characteristics of the main amplifier when under control according to the present invention.

By contrast, according to the present invention, the use of a peak value detector in the distortion detecting loop results in the control of this loop to minimize the maximum deviation of the actual input/output characteristic of the main amplifier (solid line) from the straight line deemed to represent freedom from distortion (dotted line), which is defined to be what is represented by the dotted line in FIG. 5, within the peak power range for actual use, so that linearity can be compensated up to about eight times the average power, substantially more than by the prior art.

Figure 11B:
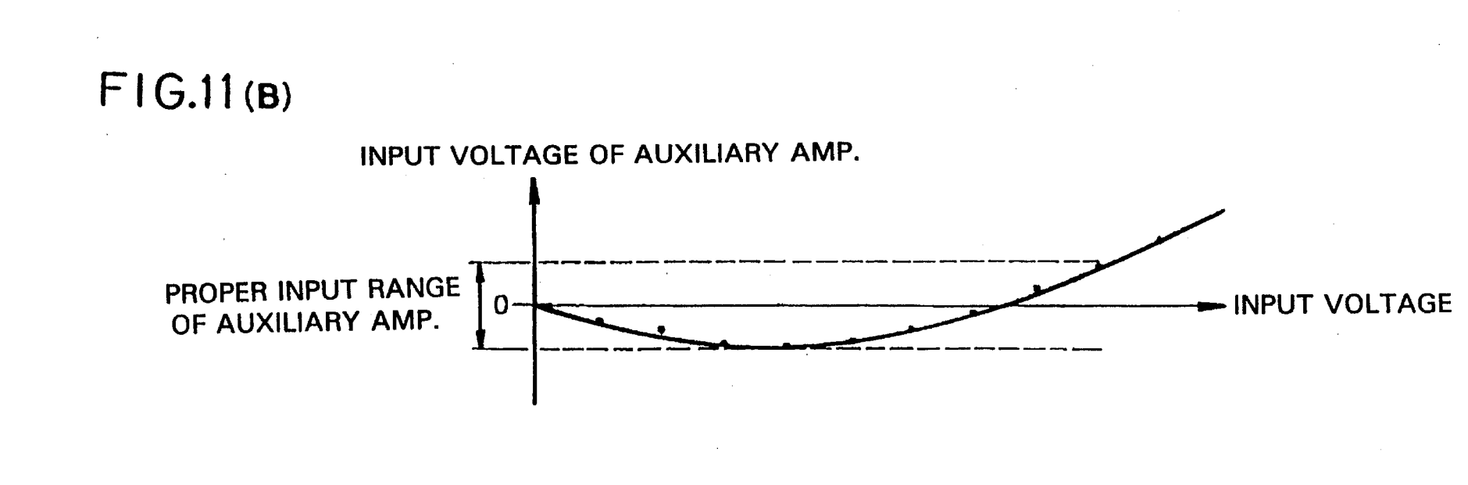

To add, FIG. 11 (B) illustrates the input voltage characteristic versus the auxiliary amplifier under control according to the present invention, indicating an expanded appropriate input range of the auxiliary amplifier.

As hitherto described, the invention provides the benefit of making available, when the distortion detecting loop is to be controlled, a wider input range and a greater output than for any conventional feed-forward amplifier by detecting the peak power of the input or output of the auxiliary amplifier, controlling a vector adjuster connected in cascade to the main amplifier so as to minimize the peak power, injecting a pilot signal either before or after the main amplifier; and regulating the auxiliary amplifier and the vector adjuster connected in cascade to the auxiliary amplifier so as to minimize the level of the pilot signal at the output end.

What is claimed is:

1. A feed-forward amplifier, comprising: a main amplifier for amplifying multi-carrier input signals; means for branching a part of the output of the main amplifier and synthesizing the branched part with said input signals; an auxiliary amplifier for amplifying this synthesized output; peak detecting means for extracting a part of the input to or the output from said auxiliary amplifier and detecting its peak value; first control means for controlling the input to said main amplifier so as to minimize the detection output of said peak detecting means; synthesizing means for synthesizing the output of said auxiliary amplifier with that of said main amplifier to cancel any distortion occurring in said main amplifier; level detecting means for extracting a part of the amplified output from said main amplifier and detecting its level; and second control means for controlling the input to said auxiliary amplifier so as to minimize the detection output of said level detecting means.

2. A feed-forward amplifier, as claimed in claim 1, wherein said peak detecting means has holding means for detecting and holding the peak value of a part of the output of said auxiliary amplifier, and said first control means has means for resetting said holding means after taking in the information held by said holding means.

3. A feed-forward amplifier, as claimed in claim 1, further including means for inserting a pilot signal of a certain frequency into the input or output of said main amplifier, wherein said level detecting means has extracting means for extracting said pilot signal from the output of said main amplifier, and said second control means is structured to control the input to said auxiliary amplifier so as to minimize the output of said extracting means.

4. A feed-forward amplifier, as claimed in claim 3, wherein said extracting means is synchronous detecting means for synchronously detecting said pilot signal.

5. A feed-forward amplifier having a distortion detection loop for taking out distortion components by amplifying multi-carrier input signals with a main amplifier and branching a part of these amplified signals, and a distortion eliminating loop for amplifying with an auxiliary amplifier the distortion components taken out by said distortion detecting loop, synthesizing the distortion components with the output signals of said main amplifier, and eliminating said distortion components by cancellation, the feed-forward amplifier comprising: peak detecting means for extracting a part of the input to or the output from said auxiliary amplifier and detecting its peak value; and control means for controlling the characteristic of said distortion detection loop so as to minimize the detection output of said peak detecting means.

6. A feed-forward amplifier, as claimed in claim 5, wherein said peak detecting means has holding means for detecting and holding the peak value of a part of the output of said auxiliary amplifier, and said control means has means for resetting said holding means after taking in the information held by said holding means.

7. A feed-forward amplifier, comprising: a main amplifier for amplifying input signals; means for branching a part of the output of the main amplifier and synthesizing the branched part with said input signals; an auxiliary amplifier for amplifying the synthesized output; peak detecting means for extracting a part of the input to or the output from said auxiliary amplifier and detecting its peak value; first control means for controlling the input to said main amplifier so as to minimize the detection output of said peak detecting means; synthesizing means for synthesizing the output of said auxiliary amplifier with that of said main amplifier to cancel any distortion occurring in said main amplifier; level detecting means for extracting a part of the amplified output from said main amplifier and detecting its level; and second control means for controlling the input to said auxiliary amplifier so as to minimize the detection output of said level detecting means;

wherein said peak detecting means has holding means for detecting and holding the peak value of a part of the output of said auxiliary amplifier, and said first control means has means for resetting said holding means after taking in the information held by said holding means.

8. A feed-forward amplifier having a distortion detection loop for taking out distortion components by amplifying input signals with a main amplifier and branching a part of these amplified signals, and a distortion eliminating loop for amplifying with an auxiliary amplifier the distortion components taken out by said distortion detecting loop, synthesizing these distortion components with the output signals of said main amplifier, and eliminating said distortion components by cancellation, further provided with peak detecting means for extracting a part of the input to or the output from said auxiliary amplifier and detecting its peak value; and control means for controlling the characteristic of said distortion detection loop so as to minimize the detection output of said peak detecting means;

wherein said peak detecting means has holding means for detecting and holding the peak value of a part of the output of said auxiliary amplifier, and said control means has means for resetting said holding means after taking in the information held by said holding means.

9. A feed-forward amplifier, comprising: a main amplifier for amplifying input multi-carrier signals; branching device to branch a part of the output of the main amplifier and synthesize the branched part with said input signals; an auxiliary amplifier for amplifying this synthesized output; peak detector for extracting a part of the input to or the output from said auxiliary amplifier and detecting its peak value; first control circuit for controlling the input to said main amplifier so as to minimize the detection output of said peak detector; synthesizer to synthesize the output of said auxiliary amplifier with that of said main amplifier to cancel any distortion occurring in said main amplifier; level detector for extracting a part of the amplified output from said main amplifier and detecting its level; and second control circuit for controlling the input to said auxiliary amplifier so as to minimize the detection output of said level detector.

10. A feed-forward amplifier having a distortion detecting loop for taking out distortion components by amplifying multi-carrier input signals with a main amplifier and branching a part of these amplified signals, and a distortion eliminating loop for amplifying with an auxiliary amplifier the distortion components taken out by said distortion detecting loop, synthesizing these distortion components with the output signals of said main amplifier, and eliminating said distortion components by cancellation, the feed-forward amplifier comprising: peak detector for extracting a part of the input to or the output from said auxiliary amplifier and detecting its peak value; and control circuit for controlling the characteristic of said distortion detection loop so as to minimize the detection output of said peak detector.

* * * * *